US006034572A

United States Patent [19]

Eastwood

[11] Patent Number: 6,034,572

[45] Date of Patent: Mar. 7, 2000

[54] MAGNETICALLY INSULATED LINE OSCILLATOR MICROWAVE PULSE GENERATOR

[75] Inventor: James William Eastwood, Sutton Courtenay, United Kingdom

[73] Assignee: AEA Technology PLC, Didcot, United Kingdom

[21] Appl. No.: 08/848,089

[22] Filed: Jun. 4, 1997

[51] Int. Cl.[7] .............................. H01J 25/34; H03B 9/08

[52] U.S. Cl. ............................ 331/82; 331/83; 315/5.32; 315/39.3

[58] Field of Search ................................ 315/39.3, 5.32; 331/82, 83

[56] References Cited

U.S. PATENT DOCUMENTS

| | | | |
|---|---|---|---|
| 3,549,940 | 12/1970 | Arnaud | 315/39.3 |
| 4,263,566 | 4/1981 | Guenard | 331/82 |
| 4,612,476 | 9/1986 | Jasper, Jr. et al. | 315/39.3 X |
| 4,785,261 | 11/1988 | Bacon et al. | 331/82 |
| 5,302,881 | 4/1994 | O'Loughlin | 315/111.21 |
| 5,742,209 | 4/1998 | Lemke et al. | 331/82 |

OTHER PUBLICATIONS

Calico et al., "Experimental and theoretical investigations of a magnetically insulated line oscillator (MILO)", SPIE, vol. 2557, pp. 50–58.

Lemke et al., "Theoretical and experimental investigation of axial power extraction from a magnetically insulated transmission line oscillator", SPIE vol. 1226, Intense Microwave and Particle Beams (1990), pp. 199–208.

*Primary Examiner*—Benny T. Lee
*Attorney, Agent, or Firm*—Larson & Taylor

[57] ABSTRACT

In a magnetically insulated line oscillator device having a cathode 11, a surrounding slow wave structure 15 has a tapered configuration so that the effective cavity depth in the slow wave structure 15 progressively diminishes along a part of the length of the device towards the power output end of the device.

14 Claims, 2 Drawing Sheets

MAGNETICALLY INSULATED LINE OSCILLATOR MICROWAVE PULSE GENERATOR

FIELD OF THE INVENTION

The invention relates to microwave generators of the type known as magnetically insulated line oscillators (MILO).

BACKGROUND OF THE INVENTION

A MILO consists of an electron-emitting cathode with an adjacent slow wave structure in a configuration similar to a linear magnetron. However, unlike a linear magnetron, there is no external means for producing a magnetic field in the space between the cathode and the adjacent slow wave structure. The insulating magnetic field is generated by current flow through the device itself. Such a device is illustrated in FIG. 1 which has cylindrical geometry so that the cathode is coaxial with the slow wave structure. The load at the output end of the device is in the form of a diode gap.

In use, a pulsed high potential is provided between the cathode and the slow wave structure. As a result, electrons are emitted from the cathode and are accelerated by the radial electric field. If this field is sufficiently large, magnetically insulated flow becomes established, where current flow at the diode region maintains an azimuthal magnetic field in the interaction space between the cathode and the slow wave structure. The combined effect of the radial electric field and the azimuthal magnetic field is to cause electrons emitted from the cathode to be confined in the region of the cathode and move axially to the output end of the device interacting with the slow wave structure as they do so in a manner analogous to that in a linear magnetron to produce microwave energy which is extracted from the output end of the slow wave structure.

A MILO with three or more cavities oscillates readily in its fundamental π-mode. In this mode, each cavity in the slow wave structure has quarter wave oscillations shifted in phase by approximately π from its neighbour. The quarter wave oscillations have maximum magnetic field at the cavity top, and maximum electric field close to the electron flow. As in the magnetron, the crossed field electron flow in the MILO develops a spoke-like structure as the electrons give up their potential and kinetic energy to the electromagnetic field.

Although large amplitude oscillations in the π-mode are readily obtained, extracting power from these oscillations is not straightforward. The reason for this, which has been known for some time, is that close to the π-mode the group velocity is small, so power cannot be transported rapidly out of the oscillator.

Possible solutions which have been considered are multicavity extraction and operation in π/2-mode. Multicavity extraction presents problems in the collection of power from multiple extraction ports. Operation in π/2-mode has been achieved by a MILO in which the slow wave structure has an input section which operates in π-mode and modulates the electron flow. The output section is designed to have a natural π-mode at twice the frequency of the input π-mode but is driven in the π/2-mode by the input section. The problem with this approach is that the output section tends to self-oscillate in its own π-mode with consequent loss of power output.

SUMMARY OF THE INVENTION

We have found that improved power extraction from a MILO device can be achieved by a tapered configuration of slow wave structure in the output section. We have also found that positioning of the diode gap (the gap between cathode and anode which controls the total current flow) affects the efficiency of power extraction.

According to the invention there is provided a magnetically insulated line oscillator device comprising an elongated electron-emitting cathode and a slow wave structure surrounding, and spaced apart from, the cathode, wherein there is provided along an active part of the length of the device a progressive change in the depth of two or more cavities in succession of the slow wave structure. By an active part of the device we mean a part in which there is interaction between electrons emitted from the cathode and the slow wave structure to generate microwave energy. For enhancing the efficiency of power extraction, the progressive change in the depth of cavities is positioned at a power output end of the device. Power extraction efficiency is further enhanced by positioning the diode gap within an active part of the length of the device. Preferably power is extracted axially from the device for which purpose a wave guide for coupling extracted microwave power to an antenna is coaxially attached to the device at its power output end.

The progressive change in the depth of cavities is conveniently provided by a linear tapering of the depth of the cavities. This may comprise a region of gentle linear taper in the depth of the cavities followed, in the direction of the output end of the device, by a region of steeper taper. The progressive change in depth of cavities may be provided by changing the position of the bottom of the cavities or alternatively by changing the height of the side walls of the cavities.

BRIEF DESCRIPTION OF THE DRAWINGS

Specific constructions of MILO device embodying the invention will now be described by way of example and with reference to the drawings filed herewith, in which.

DESCRIPTION OF EMBODIMENTS OF THE INVENTION

Figure 1:
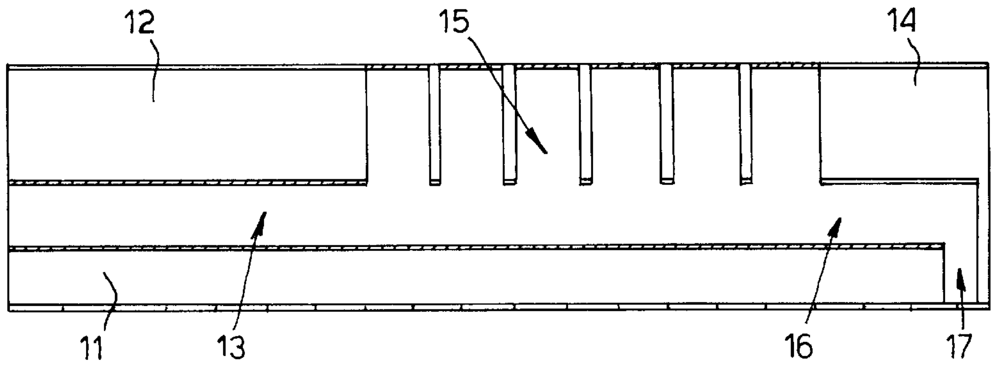
Fig.1. PRIOR ART
FIG. 1 is a diagrammatic sectional view of a known form of MILO device.

FIG. 1 shows the principal components of a known form of MILO device comprising a cylindrical cathode 11 surrounded by a cylindrical anode in which is formed a slow wave structure 15. Regions 12 and 14 of the anode together with the cathode 11 respectively provide an entrance line 13 and an exit line 16. An electrical load at the output end of the device is provided by diode gap 17 between the end of the cathode and the anode structure.

The diode gap 17 controls the total current flow, and so plays a similar role to that of the insulating magnetic field in a magnetron. If the gap 17 is too small, the electrons remain close to the cathode 11 and do not gain sufficient momentum to interact with the slow wave structure (i.e. they remain below the Buneman-Hartree threshold). If the gap is too large, magnetic insulation is lost and oscillations are quenched (Hull cut-off).

We have found that the presence of an exit line 16 beyond the slow wave structure 15 reduces efficiency. As indicated in the discussion of FIG. 2 below, output power efficiency is increased by positioning the diode gap within the slow wave structure, that is within an active part of the device.

Figure 2:
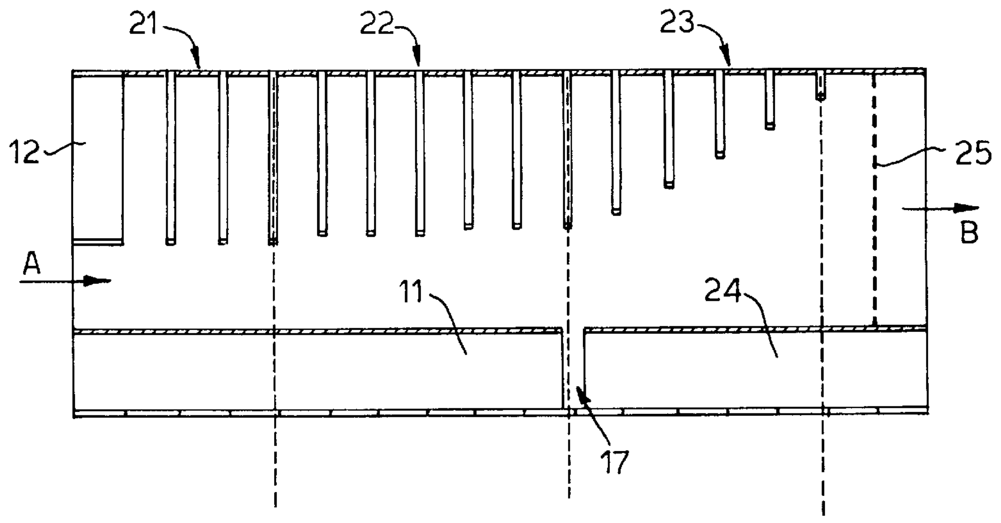
FIG. 2 is a diagrammatic sectional view of a MILO device embodying the present invention.

FIG. 2 illustrates a form of MILO embodying the present invention devised to overcome or ameliorate limitations of existing designs. In FIG. 2, components corresponding to those illustrated in FIG. 1 have been labelled with the same reference numerals and are not described in detail for FIG. 2. In this example, axial symmetry has been maintained for simplicity, compactness and predictability. It will be noted that the slow wave structure is divided into three sections marked by dotted lines. With reference again to FIG. 2, the first three cavities of the slow wave structure forming a driver section 21 are followed by an intermediate section 22 in which the walls forming the cavities progressively diminish slightly in height to produce a gentle taper in the cavity depth. This is followed by an output section 23 in which the progressive change in depth of the cavities is much steeper.

The diode gap 17 is positioned within the region of the slow wave structure, that is within an active part of the device and, in this example, adjacent the transition from the intermediate section 22 to the output section 23. Arrow A indicates the input of pulsed power from a power supply and arrow B indicates the axial extraction of microwave power pulses which are coupled to an antenna (not shown). In order that the diode gap 17 may be positioned within the slow wave structure, central cylindrical section 24 (FIG. 2) is part of the anode being electrically connected to the slow wave structure. In practice, the return current path is realised using a number of inductive post or coupling plates, but for the purposes of modelling this DC current return path is represented by an axially symmetric inductive surface 25.

The driver section 21 operates in the manner of a simple MILO in which π-mode oscillations are set up, this defining the operating frequency and driving subsequent sections by bunching the electron flow. If the MILO is to be used as a slaved amplifier rather than an oscillator, then this drive section is replaced by an input for the driver signal from an external master oscillator.

The intermediate section 22 provides a primary amplification and power extraction stage in which each successive cavity of the slow wave structure is tuned to an increasingly higher π-mode frequency. This is done in this example by an increase in the radius of the central aperture in the annular plates which form the side walls of the cavity.

Two factors influence the choice of taper defined by this progressive decrease in the depth of the cavities; they are the power flow and amplification. Increasing the taper increases the axial group velocity and hence the amount of power that can be usefully extracted along the axis. However, if the taper is too steep, then the rapid increase in axial wave phase velocity makes effective energy transfer from electrons to the wave more difficult, conditions for phase focusing of electrons become less favourable, and an increasingly large fraction of the electron flow is below the resonance threshold.

Figure 3:
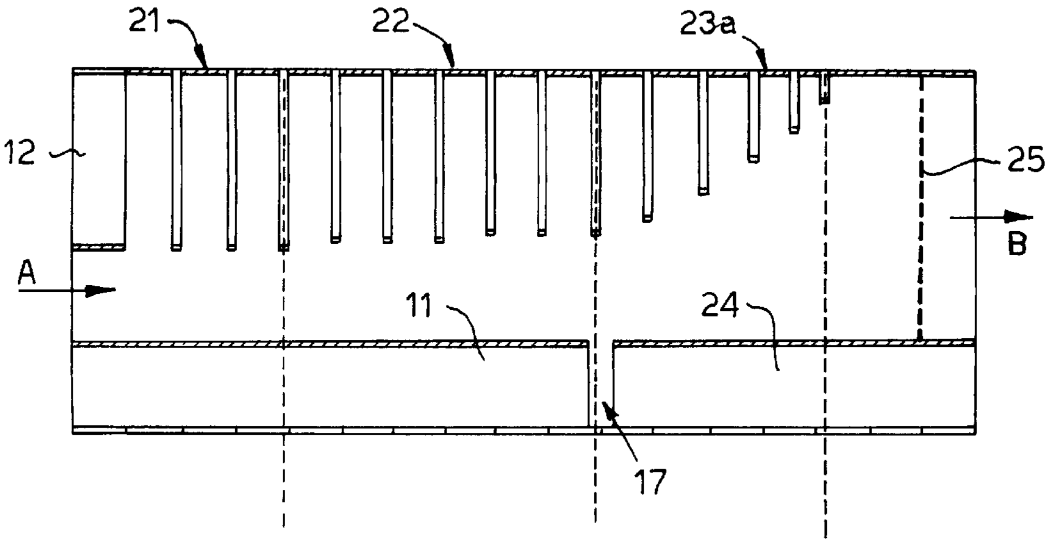
FIG. 3 is a diagrammatic end sectional view of a modification of the device shown in FIG. 2.

In optimising the design to maximise the device efficiency, both the cavity depth and cavity width may be varied. The radial cavity depth is adjusted primarily to vary the wave group velocity of the slow wave structure, and the axial cavity width primarily controls the wave phase velocity. This is illustrated in FIG. 3 where similar components carry the same reference numerals as in FIG. 2 and hence are not described in detail for FIG. 3. As may be seen in FIG. 3, both cavity depth and cavity width decrease progressively in output section 23*a*.

The output section 23*a* is generally more steeply tapered and provides a transition to the coaxial output line and additionally facilitates the extraction of power from the energetic electron jet which flows from the diode gap end of the outer cathode surface. This energetic jet is formed when spokes of high electron density reach the end of the cathode, and energy recovery from the jet can give a significant contribution to the power. The primary amplification relies upon the conventional magnetron phase focusing and power conversion by releasing (mainly) electron potential energy. The jet arising when electron spokes reach the end of the cathode feeds energy to the wave mainly by giving electron kinetic energy to the wave.

FIG. 2 shows a three stage arrangement. Useful results are achieved in the absence of the intermediate section 22. A computer simulation modelling of a device having a driver section 21 of three cavities followed immediately by an output section of five steeply tapered cavities demonstrated reaching a steady state after approximately forty nanoseconds, with an input power of 11.8 gigawatts at 460 kilovolts and an output power of 1.1 gigawatts; an efficiency of 9.2%.

However, the inclusion of the extra intermediate section 22 enables extraction of additional power by coupling the crossed field electron flow to finite group velocity waves in the driver, the gentle taper and the sharp taper. A computer simulation representing an arrangement as shown in FIG. 2 in which the radius of the inner aperture of the side walls of the cavities in the intermediate section 22 increases from 7.5 centimeters to 8.125 centimeters over six cavities, demonstrated an input power of 12 gigawatts at 460 kilovolts yielding an output of 2.1 gigawatts. This represents an electrical efficiency of 17.5%, almost twice that achieved with a device from which the intermediate section 22 is omitted and 42% of the maximum power available after subtracting the power consumed in maintaining the insulating magnetic field.

Further computer calculations indicate that even higher efficiencies can be achieved with relatively minor adjustments in physical characteristics of the device.

An experimental apparatus set up to verify the computer simulations comprised a driver section 21 of three identical cavities followed by six cavities with progressively shorter side walls.

The anode, including the slow wave structure, was made from polished stainless steel as this was found to delay the onset of breakdown effects attributed to the formation of plasma on electron bombarded surfaces. The cathode comprised an aluminium alloy rod coated with velvet.

Experimental trials with this device demonstrated good agreement between the computer simulation and the experiments except at the highest power levels where the formation of surface plasma and subsequent electron emission is thought to occur. The experimental apparatus delivered two gigawatts of power at an efficiency exceeding 10%. This result gives confidence in the computer modelling and indicates that devices with the configuration shown in FIG. 2 can confidently be predicted to achieve efficiencies in excess of 20%.

Ancillary studies have shown that, by replacing the driver section 21, tuning over a wide range of frequencies—a 30% band width to the 3 dB points—is possible and that the device as a whole can be scaled to handle higher frequencies.

The invention is not restricted to the details of the foregoing examples. For instance, the progressive change in cavity depth need not necessarily be achieved by reducing the height of the cavity walls but may, for example, be achieved by progressively reducing the radial displacement of the bottoms of the cavities or by a combination of the two.

While velvet provides an effective electron emission surface for the cathode, its power handling capability is limited and it is prone to damage, particularly during repetitive operation. Possible solutions to this problem are the use of a carbon felt in place of the velvet. Carbon felt "lights-up" promptly at low electric field, evolves less gas than velvet and is more resistant to damage. However, the conductivity of the carbon felt appears to result in a slower build up of plasma on carbon felt as compared with velvet. Tests have shown that velvet protected with a layer of MELINEX plastics film between the aluminium alloy rod and the velvet coating is less subject to damage from repetitive operation.

Figure 4:
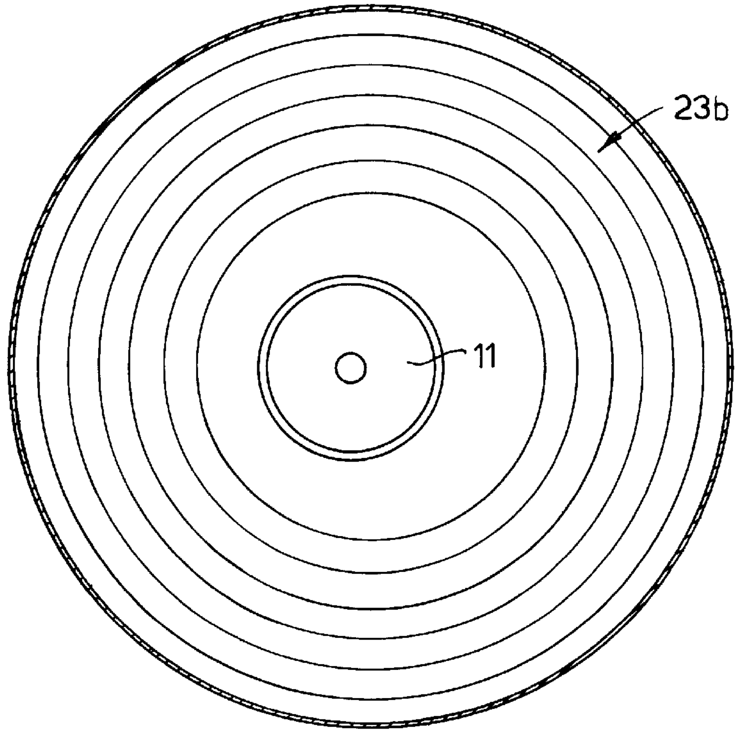
FIG. 4 is a diagrammatic sectional view of another modification of the device shown in FIG. 2.

Experiments have also shown an increase in power output for a device corresponding to that shown in FIG. 2 if the cathode is offset so that its axis is parallel to but displaced laterally from the axis of the slow wave structure. This is illustrated diagrammatically in FIG. 4, which shows the offset of cathode 11 relative to the centre of circles representing the inner radii of the walls defining the cavities in output section 23*b*.

A choke structure as described in Proceedings SPIE 1995 Vol 2557 pages 50–59 (an article by Calico, Clark, Lemke and Scott entitled "Experimental and theoretical investigations of a magnetically insulated line oscillator (MILO)") may be incorporated at the input end of the device to further improve the performance.

I claim:

1. A magnetically insulated line oscillator device comprising:

- an input end, an output end, and an axial length extending in an axial direction from the input end to the output end, the axial length including an active part for converting electron energy into microwave energy;
- an elongated electron-emitting cathode disposed along the axial length; and
- an anode in which there is a slow wave structure surrounding, and spaced apart from, the cathode to provide a series of cavities, wherein there is provided along the active part of the axial length a progressive change in depth of successive cavities of the slow wave structure such that there are three or more different depths in succession of such cavities.

2. A magnetically insulated line oscillator device as claimed in claim 1, wherein there is a diode gap between the cathode and the anode for controlling current flow therebetween and the diode gap is positioned within the active part of the axial length of the device.

3. A magnetically insulated line oscillator device as claimed in claim 1, wherein the progressive change in the respective depth of the associated cavities is positioned at the output end of the device to enhance the efficiency of power extraction.

4. A magnetically insulated line oscillator device as claimed in claim 3, wherein the progressive change is a diminution in the respective depth of the associated cavities towards the output end of the device.

5. A magnetically insulated line oscillator device as claimed in claim 1, wherein the microwave energy is extracted axially from the device.

6. A magnetically insulated line oscillator device as claimed in claim 1, wherein the cathode is aligned along an axis which is offset and displaced laterally parallel from an axis aligned with the slow wave structure.

7. A magnetically insulated line oscillator device as claimed in claim 1, wherein the progressive change is a linear tapering of the respective depth of the associated cavities.

8. A magnetically insulated line oscillator device as claimed in claim 1, wherein the progressive change comprises a region of gentle linear taper in the respective depth of the associated cavities which is followed, in the direction of towards the output end of the device, by a region of steeper taper.

9. A magnetically insulated line oscillator device as claimed in claim 1, wherein the progressive change in depth of associated cavities is provided by changing a position of respective bottoms of the associated cavities.

10. A magnetically insulated line oscillator device as claimed in claim 1, in which the progressive change in depth of the associated cavities in succession is combined with a progressive change in a respective axial width of the associated cavities.

11. A magnetically insulated line oscillator device as claimed in claim 1, wherein the cathode and slow wave structure are both cylindrical.

12. A magnetically insulated line oscillator device as claimed in claim 11 wherein the cathode is coaxial with the slow wave structure.

13. A magnetically insulated line oscillator device as claimed in claim 1, wherein the progressive change in depth of associated cavities is provided by changing a height of respective side walls of the associated cavities.

14. A magnetically insulated line oscillator device as claimed in claim 13, wherein the cathode is aligned along an axis which is offset and displaced laterally parallel from an axis aligned with the slow wave structure.

* * * * *